(12) United States Patent
Oderkerk et al.

(10) Patent No.: US 11,504,949 B2
(45) Date of Patent: *Nov. 22, 2022

(54) MULTILAYER ELEMENT

(71) Applicant: BOREALIS AG, Vienna (AT)

(72) Inventors: Jeroen Oderkerk, Stenungsund (SE); Denis Yalalov, Stenungsund (SE); Qizheng Dou, Linz (DE); Francis Costa, Linz (DE)

(73) Assignee: Borealis AG, Vienna (AT)

( * ) Notice: Subject to any disclaimer, the term of this patent is extended or adjusted under 35 U.S.C. 154(b) by 0 days.

This patent is subject to a terminal disclaimer.

(21) Appl. No.: 17/047,350

(22) PCT Filed: Apr. 16, 2019

(86) PCT No.: PCT/EP2019/059822
§ 371 (c)(1),
(2) Date: Oct. 13, 2020

(87) PCT Pub. No.: WO2019/201934
PCT Pub. Date: Oct. 24, 2019

(65) Prior Publication Data
US 2021/0114352 A1    Apr. 22, 2021

(30) Foreign Application Priority Data

Apr. 16, 2018  (EP) .................................... 18167411
Feb. 6, 2019  (EP) .................................... 19155789

(51) Int. Cl.
*B32B 17/10* (2006.01)
*C09J 123/26* (2006.01)
(Continued)

(52) U.S. Cl.
CPC .... *B32B 17/1055* (2013.01); *B32B 17/10036* (2013.01); *C09J 123/26* (2013.01);
(Continued)

(58) Field of Classification Search
None
See application file for complete search history.

(56) References Cited

U.S. PATENT DOCUMENTS

| 3,236,917 A | 2/1966 | Natta et al. |
| 4,639,495 A | 1/1987 | Waggoner |

(Continued)

FOREIGN PATENT DOCUMENTS

| CN | 1197464 A | 10/1998 |
| CN | 101517750 A | 8/2009 |

(Continued)

OTHER PUBLICATIONS

Dow Engage(R) 8150 Polyolefin Elastomer data sheet from Matweb (Year: 2022).*

(Continued)

*Primary Examiner* — Ramsey Zacharia
(74) *Attorney, Agent, or Firm* — Leydig, Voit & Mayer, Ltd.

(57) ABSTRACT

The present invention relates to a multilayer element (LE) and to a multilayer laminated glass layer element (GLE2), the use of the multilayer element (LE) and the multilayer laminated glass layer element (GLE2) for producing an article, an article comprising multilayer element (LE) or multilayer laminated glass layer element (GLE2), a layer element of at least two layers, the use of the polymer composition of the invention to produce a multilayer element (LE) or a multilayer laminated glass layer element (GLE2), as well as to a process for producing the multilayer element (LE) and an article thereof, as well as to a process for producing the multilayer laminated glass layer element (GLE2) and an article thereof.

9 Claims, 2 Drawing Sheets

(51) Int. Cl.
*H01L 31/048* (2014.01)
*H02S 20/26* (2014.01)
*B32B 27/32* (2006.01)

(52) U.S. Cl.
CPC ..... *B32B 2307/412* (2013.01); *B32B 2307/72* (2013.01); *B32B 2605/006* (2013.01); *H01L 31/0481* (2013.01); *H02S 20/26* (2014.12)

(56) References Cited

U.S. PATENT DOCUMENTS

| | | | |
|---|---|---|---|
| 4,950,541 | A | 8/1990 | Tabor et al. |
| 5,194,509 | A | 3/1993 | Hassenbein et al. |
| 5,792,560 | A | 8/1998 | Friedman et al. |
| 6,368,721 | B1 | 4/2002 | Watanabe et al. |
| 9,093,585 | B2 | 7/2015 | Seo et al. |
| 9,637,602 | B2 | 5/2017 | Potter et al. |
| 9,670,293 | B2 | 6/2017 | Reznichenko et al. |
| 9,670,347 | B2 | 6/2017 | Tölsch et al. |
| 9,708,481 | B2 | 7/2017 | Wang et al. |
| 9,745,431 | B2 | 8/2017 | Potter et al. |
| 9,751,962 | B2 | 9/2017 | Wang et al. |
| 9,777,142 | B2 | 10/2017 | Sandholzer et al. |
| 9,802,394 | B2 | 10/2017 | Cavacas et al. |
| 9,806,213 | B2 | 10/2017 | Jung et al. |
| 9,828,698 | B2 | 11/2017 | Wang et al. |
| 9,890,275 | B2 | 2/2018 | Sandholzer et al. |
| 9,976,020 | B2 | 5/2018 | Nummila-Pakarinen et al. |
| 10,011,708 | B2 | 7/2018 | Lampela et al. |
| 10,030,109 | B2 | 7/2018 | Boragno et al. |
| 10,040,930 | B2 | 8/2018 | Gloger et al. |
| 10,100,185 | B2 | 10/2018 | Wang et al. |
| 10,100,186 | B2 | 10/2018 | Wang et al. |
| 10,125,205 | B2 | 11/2018 | Pesek et al. |
| 10,227,427 | B2 | 3/2019 | Reichelt et al. |
| 10,450,451 | B2 | 10/2019 | Wang et al. |
| 10,519,259 | B2 | 12/2019 | Resconi et al. |
| 10,854,766 | B2 | 12/2020 | Jung et al. |
| 10,870,718 | B2 | 12/2020 | Denifl et al. |
| 2008/0078445 | A1* | 4/2008 | Patel ............ C08L 51/06 136/256 |
| 2008/0115825 | A1 | 5/2008 | Patel et al. |
| 2013/0255756 | A1 | 10/2013 | Seo et al. |
| 2013/0269776 | A1 | 10/2013 | Wu et al. |
| 2015/0315320 | A1 | 11/2015 | Pesek et al. |
| 2015/0343745 | A1 | 12/2015 | Pesek et al. |
| 2016/0185946 | A1 | 6/2016 | Sandholzer et al. |
| 2016/0194486 | A1 | 7/2016 | Sandholzer et al. |
| 2016/0200838 | A1 | 7/2016 | Reznichenko et al. |
| 2016/0208085 | A1 | 7/2016 | Gloger et al. |
| 2016/0229158 | A1 | 8/2016 | Cavacas et al. |
| 2016/0237270 | A1 | 8/2016 | Wang et al. |
| 2016/0244539 | A1 | 8/2016 | Resconi et al. |
| 2016/0272740 | A1 | 9/2016 | Wang et al. |
| 2016/0280899 | A1 | 9/2016 | Töltsch et al. |
| 2016/0304681 | A1 | 10/2016 | Potter et al. |
| 2016/0311951 | A1 | 10/2016 | Reichelt et al. |
| 2016/0311988 | A1 | 10/2016 | Potter et al. |
| 2016/0312018 | A1 | 10/2016 | Vestberg et al. |
| 2016/0312019 | A1 | 10/2016 | Lampela et al. |
| 2016/0336469 | A1 | 11/2016 | Jung et al. |
| 2016/0347943 | A1 | 12/2016 | Wang et al. |
| 2016/0347944 | A1 | 12/2016 | Wang et al. |
| 2017/0009068 | A1 | 1/2017 | Kahlen et al. |
| 2017/0029980 | A1 | 2/2017 | Wang et al. |
| 2017/0137617 | A1 | 5/2017 | Wang et al. |
| 2017/0166711 | A1 | 6/2017 | Boragno et al. |
| 2017/0218172 | A1 | 8/2017 | Wang et al. |
| 2017/0253012 | A1 | 9/2017 | Chang et al. |
| 2017/0313867 | A1 | 11/2017 | Lampela et al. |
| 2017/0321048 | A1 | 11/2017 | Nummila-Pakarinen et al. |
| 2017/0342182 | A1 | 11/2017 | Pesek et al. |
| 2018/0079875 | A1 | 3/2018 | Braun et al. |
| 2018/0194881 | A1 | 7/2018 | Denifl et al. |
| 2018/0198012 | A1 | 7/2018 | Jung et al. |
| 2020/0263015 | A1 | 8/2020 | Kniesel et al. |
| 2020/0270434 | A1 | 8/2020 | Van Houcke et al. |
| 2020/0277479 | A1 | 9/2020 | Jerabek et al. |
| 2020/0308353 | A1 | 10/2020 | Jerabek et al. |
| 2020/0347216 | A1 | 11/2020 | Kniesel et al. |
| 2020/0392321 | A1 | 12/2020 | Gahleitner et al. |
| 2021/0114352 | A1 | 4/2021 | Oderkerk et al. |
| 2021/0171749 | A1 | 6/2021 | Kumar et al. |
| 2021/0171750 | A1 | 6/2021 | Gahleitner et al. |
| 2021/0214527 | A1 | 7/2021 | Gahleitner et al. |
| 2021/0214533 | A1 | 7/2021 | Kulshreshtha et al. |
| 2021/0238376 | A1 | 8/2021 | Kahlen et al. |
| 2021/0253836 | A1 | 8/2021 | Gahleitner et al. |
| 2021/0269560 | A1 | 9/2021 | Krallis et al. |
| 2021/0324189 | A1 | 10/2021 | Prieto et al. |
| 2021/0332227 | A1 | 10/2021 | Wang et al. |
| 2021/0347971 | A1 | 11/2021 | Wang et al. |

FOREIGN PATENT DOCUMENTS

| | | |
|---|---|---|
| CN | 101563786 A | 10/2009 |
| CN | 103228721 A | 7/2013 |
| CN | 103339161 A | 10/2013 |
| CN | 104040730 A | 9/2014 |
| CN | 104870186 A | 8/2015 |
| CN | 105122464 A | 12/2015 |
| CN | 106062067 A | 10/2016 |
| CN | 107001693 A | 8/2017 |
| CN | 107148349 A | 9/2017 |
| EP | 2 644 652 A2 | 10/2013 |
| EP | 2 804 223 A1 | 11/2014 |
| EP | 3 112 415 A1 | 1/2017 |
| GB | 1333318 A | 10/1973 |
| JP | H07-157341 A | 6/1995 |
| JP | H09-012344 A | 1/1997 |
| JP | H09-110481 A | 4/1997 |
| JP | H11-508842 A | 8/1999 |
| JP | 2003-298092 A | 10/2003 |
| JP | 2010-504646 A | 2/2010 |
| JP | 2011-528294 A | 11/2011 |
| JP | 2014-506205 A | 3/2014 |
| JP | 2014-506938 A | 3/2014 |
| JP | 2017-504200 A | 2/2017 |
| KR | 1999-0078223 A | 10/1999 |
| WO | WO 97/11986 A1 | 4/1997 |
| WO | WO 2008/036707 A2 | 3/2008 |
| WO | WO 2008/036708 A2 | 3/2008 |
| WO | WO 2014/016205 A1 | 1/2014 |
| WO | WO 2014/176088 A1 | 10/2014 |
| WO | WO 2016/070087 A1 | 5/2016 |

OTHER PUBLICATIONS

Dow Engage(R) 8200 Polyolefin Elastomer data sheet from Matweb (Year: 2022).*
The Patent Office of the People's Republic of China, First Notification of Office Action in Chinese Patent Application No. 201980025610.8 (dated Jan. 13, 2022).
Japan Patent Office, Notice of Reasons for Rejection in Japanese Patent Application No. 2020-555897 (dated Dec. 14, 2021).
"NMR Spectra of Polymer and Polymer Additives," A.J.Brandolini and D.D. Hills, Editors, Marcel Dekker Inc. (2000) 660 pgs.
Castignolles et al., "Detection and quantification of branching in polyacrylates by size-exclusion chromatography (SEC) and melt-state $^{13}C$ NMR spectroscopy," *Polymer*, 50(11):2373-2383, (2009).
Klimke et al., "Optimisation and Application of Polyolefin Branch Quantification by Melt-State $^{13}C$ NMR Spectroscopy," *Macromol. Chem. Phys.* 207(4):382-395 (2006).
Parkinson et al., "Effect of Branch Length on $^{13}C$ NMR Relaxation Properties in Molten Poly[ethylene-co-(α-olefin)] Model Systems," *Macromol. Chem. Phys.* 208(19-20):2128-2133 (2007).
Taiwan Patent Office, Office Action in Taiwan Patent Application No. 108113217 (dated Apr. 8, 2020).
European Patent Office, International Search Report in International Application No. PCT/EP2019/059822 (dated Jul. 2, 2019).
European Patent Office, Written Opinion in International Application No. PCT/EP2019/059822 (dated Jul. 2, 2019).

(56) References Cited

OTHER PUBLICATIONS

International Bureau of WIPO, International Preliminary Report on Patentability in International Application No. PCT/EP2019/059822 (dated Oct. 20, 2020).
Japan Patent Office, Decision of Rejection issued in Japanese Patent Application No. 2020-555897 (dated Sep. 13, 2022).

* cited by examiner

MULTILAYER ELEMENT

CROSS-REFERENCE TO RELATED APPLICATIONS

This patent application is the U.S. national phase of International Application No. PCT/EP2019/059822, filed on Apr. 16, 2019, which claims the benefit of European Patent Application No. 18167411.0, filed Apr. 16, 2018, and European Patent Application No. 19155789.1, filed Feb. 6, 2019, the disclosures of which are incorporated herein by reference in their entireties for all purposes.

The present invention relates to a multilayer element (LE) and to a multilayer laminated glass layer element (GLE), being suitable i.a. for use in construction applications, vehicles etc., like a safety layer element, an insulation element or a thermal layer element, or in any combination thereof, an article comprising the multilayer element (LE) and the multilayer laminated glass layer element (GLE), a layer element of at least two layers, the use of the polymer composition of the invention to produce the multilayer element (LE) and the multilayer laminated glass layer element (GLE), and an article thereof, as well as to a process for producing the multilayer element (LE) and the multilayer laminated glass layer element (GLE), and the article thereof.

BACKGROUND ART

For instance in construction applications, like building applications, different type of layer elements are used including facade, window, wall and door elements. These layer elements may be designed to have various features, like protective, i.e. safety, insulation and/or thermal feature, just as an example.

Accordingly, e.g. elements with safety functionality include so called "safety glass" elements of various types for use in various applications. "Safety glass" means herein a laminated glass layer element or a laminated polymeric layer element, typically a laminated glass layer element, with additional safety feature which makes it less likely to break, or if breaks, then typically holds together when shattered.

Laminated glass, such as safety glass, can be e.g. a layer element comprising typically a first rigid layer, at least an interlayer and a second layer, in that order. The first rigid layer and optionally (and conventionally) the second layer are typically layer(s) of a glass material or of a rigid polymeric material, like polycarbonate. The interlayer between said first and second rigid layer is often based on polyvinyl butyral (PVB) or ethylene-vinyl acetate (EVA).

When the first and/or second layer element (typically of glass material) break(s), then the interlayer element should hold/support/bond the first layer element and the second layer element together (bonded). I.e. the interlayer element has an adhering function, namely prevents the first and/or second layer element from breaking up into large sharp pieces.

Accordingly, safety glass is normally used when there is a possibility of human impact or where the glass could fail if shattered.

The use of PVB as interlayer material may have a drawback of being sensitive to moisture and usually requires special controlled storage conditions (temperature and humidity). Moreover, due to moisture sensitivity the adhesion properties may be impaired.

In case of EVA as interlayer material, EVA must usually have high VA content to get feasible flowability/processability behavior. The conventional EVA with high VA content has then also very high $MFR_2$ (more than 15 g/10 min). A major drawback in using EVA is the yellowing over time (i.e. weathering). Furthermore, volatile organic components like acetic acid are formed over time, which leads to corrosion issues.

For instance, a laminated glass layer element for applications for vehicle, building and construction, architectural glasses, interior/exterior design applications, (usually of glass or non-flexible polymeric material) is typically produced by laminating the layer elements together. For the production of architectural and automotive laminated safety glass with a polymer material interlayer, like PVB interlayer, direct pressing of the loosely placed sandwich glass/film/glass is not a suitable method to produce said laminated safety glass without air inclusions. For example, the lamination of safety glass with PVB as interlayer is mostly done in two production steps to eliminate any air inclusions in the final product. The first step, so-called pre-lamination, is processed prior to the actual heating-pressing step. The quality of this pre-lamination is of major importance for the quality of the final laminated glass. A distinction is made in pre-lamination between rolling press and the vacuum process. The latter is subdivided into the vacuum bag process and the vacuum-ring process. During the second step, these pre-laminated constructions are then heated under pressure in an autoclave or oven, to achieve the final bounded product.

Lamination process in case of PVB requires high temperature and long duration.

The properties of the chosen layer materials may also not be sufficient to meet overall property requirements needed for the above end applications.

One important property for laminated glass applications, like safety glass is haze, which should be as low as possible, while keeping mechanical properties on a high level.

Accordingly, there is a continuous need for solutions of layer elements suitable i.a. for use in demanding construction, vehicle etc. applications, like safety, insulation and/or thermal end applications, to meet the challenging requirements for industrially feasible solutions.

BRIEF DESCRIPTION OF THE DRAWINGS

FIG. 1 illustrates the most preferable embodiment of the multilayer element (LE) of the invention and of the laminated glass layer element (GLE) of the invention, wherein the surface of the interlayer layer element (i) facing the surface of the first layer element (1) are in direct contact with each other and preferably without any adhesive layer(s) in between; and, on the opposite side of the interlayer element (i), the surface of the interlayer layer element (i) facing the surface of the second layer element (2) are in direct contact with each other and preferably without any adhesive layer(s) in between.

THE DESCRIPTION OF THE INVENTION

Figure 1:
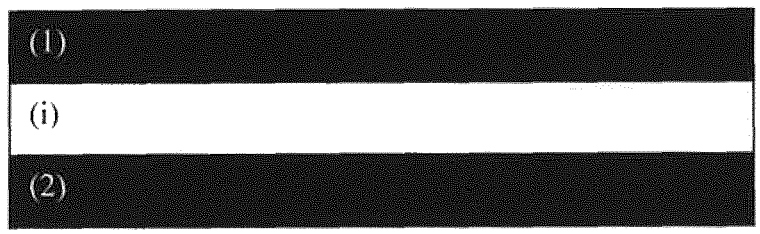

Accordingly, the present invention is in a first aspect directed to a multilayer element (LE) comprising a first layer element, an interlayer element and a second layer element, in the given order, wherein the first layer element comprises a glass layer or a polymeric layer;

the interlayer element comprises a polymer composition comprising a copolymer (a) of ethylene and a $C_4$ to $C_8$ alpha olefin comonomer, the copolymer (a) having (i) a density in a range of from 850 kg/m³ to below 880 kg/m³ (measured according to ISO 1183)

(ii) an $MFR_2$ in a range of from 0.1 to 20.0 g/10 min (measured according to ISO 1133 at 190° C. and a load of 2.16 kg) and which copolymer (a) optionally bears silane group(s) containing units (b) or unsaturated organic groups containing a carbonyl group (c), the second layer element comprises a glass layer or a polymeric layer; and wherein the interlayer element is in adhering contact with said first and second layer element.

In a specific embodiment of the first aspect, the present invention relates to a laminated glass layer element (GLE1) comprising a first glass layer element, an interlayer element and a second glass layer element, in the given order, wherein the interlayer element comprises a polymer composition comprising a copolymer (a) of ethylene and a $C_4$ to $C_8$ alpha olefin comonomer, the copolymer (a) having (i) a density in a range of from 850 kg/m³ to below 880 kg/m³ (measured according to ISO 1183)

(ii) an $MFR_2$ in a range of from 0.1 to 20.0 g/10 min (measured according to ISO 1133 at 190° C. and a load of 2.16 kg) and, which copolymer (a) optionally bears silane group(s) containing units (b) or unsaturated organic groups containing a carbonyl group (c), and the interlayer element is in adhering contact with said first glass layer element and said second glass layer element.

The present invention is in a second aspect directed to a multilayer laminated glass layer element (GLE2) comprising a first glass layer element, an interlayer element and a second glass layer element, in the given order, wherein the interlayer element comprises a polymer composition comprising a copolymer (a) of ethylene and a $C_4$ to $C_8$ alpha olefin comonomer, which has been grafted with an acidic grafting agent (e), the copolymer (a) before grafting having (i) a density in a range of from 850 kg/m³ to below 880 kg/m³ (measured according to ISO 1183)

(ii) an $MFR_2$ in a range of from 0.1 to 40.0 g/10 min (measured according to ISO 1133 at 190° C. and a load of 2.16 kg) and and wherein the interlayer element adheres to said first and second glass layer element.

The multilayer element (LE) as defined above, below or in the claims can be used for any purposes needed, and the multilayer laminated glass layer element (GLE2) as defined above, below or in the claims can be used for any laminated glass purposes needed, e.g. in construction, building or vehicles, like as a safety layer element, an insulation layer element or a thermal layer element, or in any combination thereof.

Consequently, the multilayer element (LE) and the multilayer laminated glass layer element (GLE2) of the invention preferably have at least one of safety, insulation or thermal feature in that each of the multilayer element (LE) and the multilayer laminated glass layer element (GLE2) meets demanding requirements for use as part or as such in a safety, insulation and/or thermal layer element applications.

The multilayer element (LE), as defined above, below or in claims, is referred herein also shortly as "layer element (LE)".

The multilayer laminated glass layer element (GLE2), as defined above, below or in claims, is referred herein also shortly as "glass layer element (GLE2)".

The first glass layer element and, respectively, the second glass layer element of the multilayer laminated glass layer element (GLE2) as defined above, below or in claims, are referred herein also as the "first layer element" and as the "second layer element".

The first layer element and, respectively, the second layer element of the multilayer element (LE) as defined above, below or in claims are preferably rigid layer elements.

"Rigid" means herein that the element is stiff and cannot be bended in a manner as flexible elements, and if bended, then typically the integrity of the element typically breaks easily causing permanent fractures, as is not the case with flexible element. A skilled person can easily differentiate a rigid and flexible layer element.

As defined above, below or in claims, these layer elements, preferably rigid layer elements, of the multilayer element (LE) as defined above, below or in claims can be independently a glass layer or a polymeric layer.

The expression "the interlayer element adheres to said first and second glass layer element" of the second aspect of the present invention means that the interlayer element is in adhering contact with said first and second glass layer element".

Accordingly, one of the outmost surfaces of the interlayer element is adhering to the outmost surface of the first layer element and, respectively, the other outmost surface of the interlayer element is adhering to the outmost surface of the second layer element. This can be in direct adhering contact or, alternatively, there can be an adhesive layer between the adhering surface of the interlayer element and one or both of the first layer element and the second layer element.

The same counts for the expression "the interlayer element is in adhering contact with said first and second layer element" of the first aspect of the present invention.

The expression "element" in said first layer element, in said second layer element and in said interlayer element refers in this application to different functionalities of these layer components, namely said first and second layer element have independently one or more functions related to the end use of the multilayer element, such as e.g. safety, insulation and/or thermal function, whereas the interlayer element has differing, i.e. adhering, function. All these functional layer elements together with interlayer element provide the resulting, e.g. safety, insulation and/or thermal, functionality to the final article.

Meaning of safety element is already given above under background art. The insulation element includes acoustic (sound) insulation element or thermal insulation element as known in the art. The insulation element can also have both acoustic and thermal functionalities. The thermal element can be provided e.g. with heating means, like electrical wires. The heating is then effected by conducting electric current to said wires. Example of a combination of safety and thermal element is e.g. front window (windscreen) in vehicles, like cars, which is provided with heating means and also functions as safety glass.

The ethylene copolymer (a), as defined above, below or in claims, is referred herein also shortly as "polymer (a)" or "copolymer (a)".

As well known "comonomer" refers to copolymerizable comonomer units, i.e. for copolymer (a) a C4 to C8 alpha olefin comonomer, like 1-octene.

By grafted copolymer we mean the copolymer (a) which has been grafted using an acidic grafting agent (b). The skilled person will understand that during the grafting process the acidic grafting agent (b) becomes chemically bound (usually via at least one covalent bond) to the copolymer (a). Thus, the "grafted copolymer" comprises (e.g. consists of) the copolymer (a) and the acidic grafting agent (b) chemically bound to each other. Therefore the terms "grafted copolymer", and "copolymer (a) of ethylene and a $C_4$ to $C_8$ alpha olefin comonomer, which has been grafted with an acidic grafting agent (b)" can be used interchangeable.

The grafted copolymer will be referred to herein also as the "g-copolymer (a')" or grafted copolymer (a'). The copolymer (a) prior to grafting is referred to herein as defined above.

The claimed specific interlayer element comprising the copolymer (a) of the layer element (LE) of the first aspect of the invention and the claimed specific interlayer element comprising the grafted copolymer (a') of the laminated glass layer element (GLE2) of the second aspect of the invention have surprisingly low haze.

In addition the use of copolymer (a) or of the grafted copolymer (a''), respectively, for the specific interlayer has several advantages compared to EVA and/or PVB used according to the state of the art, since the copolymer (a) and the grafted copolymer (a') i.a. are easier to store than PVB, releases no acid at temperatures above 150° C. as EVA and has no strong smell like EVA or PVB.

The invention also provides the use of the polymer composition as defined above, below or in claims, for producing a multilayer element (LE), or a laminated glass layer element (GLE1), or a laminated glass layer element (GLE2), or an article comprising the multilayer element (LE), or an article comprising the laminated glass layer element (GLE1), or an article comprising the laminated glass layer element (GLE2).

The invention further provides the use of the polymer composition of the invention for producing a multilayer element (LE), as defined above, below or in claims, the use of said multilayer element (LE) for producing an article comprising said multilayer element (LE).

The invention further provides the use of the polymer composition of the invention for producing a laminated glass layer element (GLE1), as defined above, below or in claims, the use of said laminated glass layer element (GLE1) for producing an article comprising said laminated glass layer element (GLE1).

The invention further provides the use of the polymer composition of the invention for producing a laminated glass layer element (GLE2), as defined above, below or in claims, the use of said laminated glass layer element (GLE2) for producing an article comprising said laminated glass layer element (GLE2).

The invention further provides an article comprising the multilayer element (LE) as defined above, below or in claims.

The invention further provides an article comprising the laminated glass layer element (GLE1) as defined above, below or in claims.

The invention further provides an article comprising the multilayer laminated glass layer element (GLE2) as defined above, below or in claims.

The invention further provides the use of the multilayer element (LE) as defined above, below or in claims, or of the laminated glass element (GLE1) as defined above, below or in claims, or of the laminated glass element (GLE2), for producing an article comprising the multilayer element (LE), or the laminated glass layer element (GLE1), or the laminated glass element (GLE2), for construction applications, like elements in buildings, for instance architectural elements, such as exterior/interior elements, like facades outside the building, window elements, door elements or indoor wall elements; for elements in bridges; for elements in vehicles, such as windows in cars, trains, airplanes or ships; for elements in production equipment, like safety windows in machines; for elements in household devices; for projection applications, like head-up displays, or for elements in furniture etc.

The invention further provides an article, as defined above, below or in claims, which is an article for construction applications, like elements in buildings, for instance architectural elements, such as exterior/interior elements, like facades outside the building, window elements, door elements or indoor wall elements; for elements in bridges; for elements in vehicles, such as windows in cars, trains, airplanes or ships; for elements in production equipment, like safety windows in machines; for elements in household devices; for projection applications, like head-up displays, or for elements in furniture etc., preferably, which is an article selected from a safety layer element, an insulation layer element or a thermal layer element, or any combination thereof, preferably an article which is a safety layer element, an insulation layer element or a thermal layer element, or any combination thereof consisting of the multilayer element (LE), or of the laminated glass element (GLE1), or of the laminated glass element (GLE2).

The invention further provides a process for producing the multilayer element (LE) of the invention.

The invention further provides a process for producing the laminated glass layer element (GLE1) of the invention.

The invention further provides a process for producing the laminated glass layer element (GLE2) of the invention.

The invention further provides a process for producing an article of the invention.

The multilayer element (LE), the laminated glass layer element (GLE1), the multilayer laminated glass layer element (GLE2), the interlayer element, the polymer composition, the polymer (a) thereof, the first and second layer elements, the article and process for producing the layer element (LE) and article thereof, as well as the article and process for producing the laminated glass layer element (GLE1) and article thereof, as well as the article and process for producing the laminated glass layer element (GLE2) and article thereof, together with further details, preferred embodiments, ranges and properties thereof, are described below and in claims, which preferred embodiments, ranges and properties can be in any combination and combined in any order.

The Interlayer Element

The interlayer layer element according the first aspect comprises a layer which comprises, preferably consists of, a polymer composition comprising the polymer (a).

The interlayer layer element according the second aspect comprises a layer which comprises, preferably consists of, a polymer composition comprising the grafted copolymer (a'), i.e. the copolymer (a) of ethylene and a $C_4$ to $C_8$ alpha olefin comonomer, which has been grafted with an acidic grafting agent (b).

The polymer composition is referred herein also shortly as "the composition" or "the composition of the invention". The interlayer layer element may be a monolayer element comprising, preferably consisting of, the polymer (a), or the grafted copolymer (a'). Alternatively, the interlayer layer element of the first aspect may comprise two or more layers which each comprise, preferably consist of, a polymer composition comprising the polymer (a), and the interlayer layer element of the second aspect may comprise two or more layers which each comprise, preferably consist of, a polymer composition comprising the grafted copolymer (a'). If such layers of polymer composition of the invention are adjacent, then they are considered as a "monolayer", since fused together by before solidification of such layers during the production process of the layer element.

The polymer (a) is a copolymer of ethylene and a $C_4$ to $C_8$ alpha-olefin comonomer. Such copolymers can be an elastomer, a plastomer or a linear low density polyethylene (LLDPE).

$C_4$ to $C_8$ alpha-olefin comonomers are for example 1-butene, 1-hexene or 1-octene. Preferably, the comonomer is 1-butene or 1-octene, more preferably the comonomer is 1-octene.

The amount of comonomer is usually in the range of 20.0 wt % to 45.0 wt %, depending on the chosen comonomer and the desired density.

Suitable copolymers (a) have a density in the range of from 850 to below 880 kg/m$^3$, preferably in the range of from 855 to 875 kg/m$^3$ and more preferably in the range of 860 to 870 kg/m$^3$.

The MFR$_2$ (ISO 1133; 190° C.; 2.16 kg) of suitable copolymers (a) of the first aspect is in the range of 0.1 to 20.0 g/10 min, preferably in the range of 0.5 to 15.0 g/10 min and more preferably in the range of 1.0 to 10.0 g/10 min.

The MFR$_2$ (ISO 1133; 190° C.; 2.16 kg) of suitable copolymers (a) of the second aspect is in the range of 0.1 to 40.0 g/10 min, preferably in the range of 0.5 to 20.0 g/10 min, more preferably in the range of 1.0 to 15.0 g/10 min and even more preferably in the range of 1.0 to 10.0 g/10 min.

The melting points (measured with DSC according to ISO 11357-3:1999) of suitable copolymers (a) of the first aspect are below 100° C., preferably below 80° C., more preferably below 70° C. and most preferably below 60° C.

The melting points (measured with DSC according to ISO 11357-3:1999) of suitable copolymers (a) of the second aspect are below 100° C., preferably below 90° C., more preferably below 80° C. and most preferably below 70° C.

The melting points of suitable copolymers (a) of the second aspect can therefore be in a range of from 30° C. to below 100° C., preferably in a range of from 30° C. to below 90° C., more preferably in a range of from 30° C. to below 80° C. and most preferably in a range of from 30° C. to below 70° C.

The molecular mass distribution (also addressed herein as dispersity) $M_w/M_n$ of suitable copolymers (a) is most often below 4, such as 3.8 or below, but is at least 1.7. It is preferably between 3.5 and 1.8.

Suitable copolymers (a) can be any copolymer of ethylene and $C_4$ to $C_8$ alpha-olefin comonomer having the above defined properties, which are commercial available, i.a. from *Borealis* AG under the tradename Queo, from DOW under the tradename Engage or Affinity, or from Mitsui under the tradename Tafmer.

Alternately these copolymers (a) can be prepared by known processes, in a one stage or two stage polymerization process, comprising solution polymerization, slurry polymerization, gas phase polymerization or combinations therefrom, in the presence of suitable catalysts, like vanadium oxide catalysts or single-site catalysts, e.g. metallocene or constrained geometry catalysts, known to the art skilled persons.

Preferably these copolymers (a) are prepared by a one stage or two stage solution polymerization process, especially by high temperature solution polymerization process at temperatures higher than 100° C.

Such process is essentially based on polymerizing the monomer and a suitable comonomer in a liquid hydrocarbon solvent in which the resulting polymer is soluble. The polymerization is carried out at a temperature above the melting point of the polymer, as a result of which a polymer solution is obtained. This solution is flashed in order to separate the polymer from the unreacted monomer and the solvent. The solvent is then recovered and recycled in the process.

Preferably the solution polymerization process is a high temperature solution polymerization process, using a polymerization temperature of higher than 100° C. Preferably the polymerization temperature is at least 110° C., more preferably at least 150° C. The polymerization temperature can be up to 250° C.

The pressure in such a solution polymerization process is preferably in a range of 10 to 100 bar, preferably 15 to 100 bar and more preferably 20 to 100 bar.

The liquid hydrocarbon solvent used is preferably a $C_{5-12}$-hydrocarbon which may be unsubstituted or substituted by $C_{1-4}$ alkyl group such as pentane, methyl pentane, hexane, heptane, octane, cyclohexane, methylcyclohexane and hydrogenated naphtha. More preferably unsubstituted $C_{6-10}$-hydrocarbon solvents are used.

A known solution technology suitable for the process according to the invention is the BORCEED (former COMPACT) technology.

The optional silane group(s) containing units (b) of the first aspect are preferably present as a compound grafted chemically to the polymer (a).

In a preferred embodiment of the first aspect of the present invention copolymer (a) bears silane group(s) containing units (b), whereby these units (b) are introduced with grafting component (b').

Accordingly, in grafting the polymer (a) is first polymerized to a polymer and the final polymer is attained by grafting, with peroxide, the grafting component (b'), whereby one of the C atoms of the vinyl unsaturation is attached to the polymer backbone, as well known to a skilled person. Grafting of the grafting component (b') to a copolymer is a well known technique and well documented in the polymer field and within the skills of a skilled person.

To achieve the grafting of the grafting component (b'), i.e. to produce a polymer composition comprising copolymer (a) bearing silane group(s) containing units (b), a radical initiator (d) is necessary, which is preferably a thermally decomposing free radical-forming agents. A radical initiator (d) is typically a peroxy radical initiator and preferably present at a concentration of at least 50 ppm, typically between 50 and 1000 ppm relative to the total amount of (a) and (b'). Preferably, the thermally decomposing free radical-forming agents selected from the group consisting of acyl peroxide, alkyl peroxide, hydroperoxide, perester and peroxycarbonate.

Suitable examples of radical initiator (d) are described for example in WO 2014/016205 and are incorporated herein by reference. The radical initiator (d) is preferably chosen from the group comprising Dibenzoyl peroxide, tert-Butyl peroxy-2-ethylhexanoate, tert-Amyl peroxy-2-ethylhexanoate, tert-Butyl peroxydiethylacetate, 1,4-Di(tert-butylperoxycarbo)-cyclohexane, tert-Butyl peroxyisobutyrate, 2,5-Dimethyl-2,5-di-(tert.-butylperoxy)-hexane, 1, 1-Di(tert-butylperoxy)-3,3,5-trimethyl-cyclohexane, Methyl isobutyl ketone peroxide, 2,2-Di(4,4-di(tert-butylperoxy)cyclohexyl)propane, 1,1-Di(tertbutylperoxy) cyclohexane, tert-Butyl peroxy-3,5,5-trimethylhexanoate, tert-Amylperoxy 2-ethylhexyl carbonate, 2,2-Di (tert-butylperoxy)butane, tert-butylperoxy isopropyl carbonate, tert-Butylperoxy 2-ethylhexyl carbonate, tert-Butyl peroxyacetate, tert-butyl peroxybenzoate, Di-tert-amyl peroxide and mixtures of these organic peroxides.

In a preferred process, the grafting component (b') and the radical initiator (d) are continuously dosed into an extruder, preferably as a mixture of the grafting component (b') and the radical initiator (d), and copolymer (a). The degree of grafting can be controlled by choosing an appropriate dosing regime for the radical initiator (d) and the grafting component (b').

The process for the preparation of the polymer composition comprising copolymer (a) bearing silane group(s) containing units (b), is preferably carried out in an extruder, preferably a twin-screw extruder and preferably comprising two high intensity mixing segments. The copolymer (a) is heated to a temperature between 180 and 230° C., more preferably between 185 and 225° C. In a specific embodiment, the extruder is a co-rotating twin-screw extruder having at least four zones, or at least six zones, wherein the temperature in the first zone is higher than 100° C., the temperature in the second zone is at least 110° C., the temperature in the third zone is higher than 160° C., the temperature in the fourth zone is at least 190° C. and wherein the temperature in any subsequent zone (if at least 6 zones are used) is higher than 150° C., but wherein the temperature in any zone is lower than 230° C.

The overall residence time of the polymer composition in the extruder is preferably between 30-100 sec. It is believed that the grafting occurs on all constituent components of the copolymer (a) rather uniformly.

In view of achieving a sufficiently high degree of grafting on one hand and an acceptable low change of the melt flow rate, in the process the radical initiator (d) is preferably added in an amount between 0.01 and 1.0 wt % and preferably less than 1.0 wt %, more preferably less than 0.1 wt %, even more preferably less than 0.05 wt % relative to the total weight of components (a) to (d).

The grafting component (b') is added in such an amount, so that between 0.1 and 2.0 wt % of component (b') is grafted on said copolymer (a).

A good balance of degree of grafting and low MFR change is obtained when the relative amount of radical initiator (c) relative to the total amount of (b') and (c) is preferably less than 25 wt %, more preferably less than 20, 15, 10 or even less than 5 wt % and preferably the amount of component (b') added is at least 0.5 more preferably at least 1.0 or even 1.5 wt % and preferably typically less than 5.0 wt % relative to the total weight of the composition.

In the preferred case that copolymer (a) bears silane group(s) containing units (b), these units are introduced with grafting component (b'), which is preferably a hydrolysable unsaturated silane compound represented by the formula (I):

$$R^1SiR^2_qY_{3-q} \qquad (I)$$

wherein
$R^1$ is an ethylenically unsaturated hydrocarbyl, hydrocarbyloxy or (meth)acryloxy hydrocarbyl group,
each $R^2$ is independently an aliphatic saturated hydrocarbyl group, Y which may be the same or different, is a hydrolysable organic group and
q is 0, 1 or 2.

Further suitable silane group(s) containing unit is e.g. gamma-(meth)acryl-oxypropyl trimethoxysilane, gamma (meth)acryloxypropyl triethoxysilane, and vinyl triacetoxysilane, or combinations of two or more thereof.

One suitable subgroup of the grafting compound (b') of formula (I) is an unsaturated silane compound of formula (II)

$$CH_2=CHSi(OA)_3 \qquad (II)$$

wherein each A is independently a hydrocarbyl group having 1-8 carbon atoms, suitably 1-4 carbon atoms.

The grafting compound (b') is preferably the compound of formula (II) which is vinyl trimethoxysilane, vinyl bismethoxyethoxysilane, vinyl triethoxysilane, more preferably vinyl trimethoxysilane or vinyl triethoxysilane and most preferably vinyl trimethoxysilane.

The amount (wt %) of the silane group(s) containing units (b) present in the copolymer (a), is preferably 0.1 to 2.0 wt %, preferably 0.4 to 1.6 wt % and even more preferably 0.5 to 1.5 wt %, when determined according to "Quantification of VTMS in coplymer-g-VTMS" as described below under "Determination Methods".

In one other embodiment of the first aspect of the present invention, copolymer (a) bears unsaturated organic groups containing a carbonyl group (c) instead of silane group(s) containing units (b).

Any unsaturated organic compound containing at least one ethylenic unsaturation (e.g., at least one double bond), at least one carbonyl group (—C═O), and that will graft to the copolymer (a) can be used as the grafting material in this embodiment of the invention.

Representative of compounds that contain at least one carbonyl group are the carboxylic acids, anhydrides, esters and their salts, both metallic and nonmetallic. Preferably, the organic compound contains ethylenic unsaturation conjugated with a carbonyl group. Representative compounds include maleic, fumaric, acrylic, methacrylic, itaconic, crotonic, α-methyl crotonic, and cinnamic acid and their anhydride, ester and salt derivatives, if any. Maleic anhydride is the preferred unsaturated organic compound containing at least one ethylenic unsaturation and at least one carbonyl group.

The same general principles for the grafting step apply here as described above for the grafting step with component (b'). It is within the skills of an art skilled person to make the any necessary adaptation.

Preferably, the copolymer (a) bears silane group(s) containing units (b).

The copolymer (a) of the second aspect of the present invention is grafted with an acidic grafting agent (e).

As acid grafting agent (e), any such agent can be used which is known to be suitable for this purpose by the person skilled in the art.

Preferably, the acid grafting agent (e) is an unsaturated mono- or dicarboxylic acid or a derivative thereof such as anhydrides, esters and salts (both metallic and nonmetallic).

Preferably, the unsaturated group is in conjugation with the carboxylic group.

Examples of such grafting agents include acrylic acid, methacrylic acid, fumaric acid, maleic acid, nadic acid, citraconic acid, itaconic acid, crotonic acid, and their anhydrides, metal salts, esters, amides or imides.

The preferred grafting agents are maleic acid and its derivatives such as anhydrides, esters and salts, and in particular maleic acid anhydride.

Grafting of a copolymer with an unsaturated organic compound containing a carbonyl group is a well-known technique and well documented in the polymer field and within the skills of a skilled person.

Grafting can be carried out by any process known in the art such as grafting in a melt without a solvent or in solution or dispersion or in a fluidised bed. Typically, grafting is performed in a heated extruder or mixer as e.g. described in U.S. Pat. No. 3,236,917 A, 4,639,495 A, 4,950,541 A or 5,194,509 A.

Typically, grafting is carried out in a twin-screw extruder such as described in U.S. Pat. No. 4,950,541 A.

Grafting may be carried out in the presence or absence of a radical initiator but is preferably carried out in the presence of a radical initiator such as an organic peroxide, organic perester or organic hydroperoxide.

To achieve the grafting, i.e. to produce a polymer composition comprising the grafted copolymer (a'), preferably a radical initiator (0 is used, which is preferably a thermally decomposing free radical-fainting agents. A radical initiator (f) is typically a peroxy radical initiator and preferably present at a concentration of at least 50 ppm, typically between 50 and 1000 ppm relative to the total amount of copolymer (a) and acidic grafting agent (e). Preferably, the thermally decomposing free radical-forming agents selected from the group consisting of acyl peroxide, alkyl peroxide, hydroperoxide, perester and peroxycarbonate.

Suitable examples of radical initiator (0 are described for example in WO 2014/016205 and are incorporated herein by reference. The radical initiator (f) is preferably chosen from the group disclosed above in connection with the radical initiator (d) of the first aspect of the present invention.

In a preferred process, the acidic grafting agent (e) and the radical initiator (0 are continuously dosed into an extruder, preferably as a mixture of the acidic grafting agent (e) and the radical initiator (0, and copolymer (a). The degree of grafting can be controlled by choosing an appropriate dosing regime for the radical initiator (f) and the acidic grafting agent (e).

In another preferred process the copolymer (a) is mixed with the acidic grafting agent (e) before dosing into the extruder (e.g. as dry blend) and the radical initiator (f) is fed separately.

The process for the preparation of the polymer composition comprising the grafted copolymer (a') is preferably carried out in an extruder, preferably a twin-screw extruder and preferably comprising two high intensity mixing segments. The copolymer (a) is heated to a temperature between 175 and 230° C., more preferably between 180 and 225° C. In a specific embodiment, the extruder is a co-rotating twin-screw extruder having at least four zones, or at least six zones, wherein the temperature in the first zone is higher than 100° C., the temperature in the second zone is at least 110° C., the temperature in the third zone is higher than 160° C., the temperature in the fourth zone is at least 190° C. and wherein the temperature in any subsequent zone (if at least 6 zones are used) is higher than 150° C., but wherein the temperature in any zone is lower than 230° C.

The overall residence time of the polymer composition in the extruder is preferably between 30-100 sec. It is believed that the grafting occurs on all constituent components of the copolymer (a) rather uniformly.

In view of achieving a sufficiently high degree of grafting on one hand and an acceptable low change of the melt flow rate, in the process the radical initiator (f) is preferably added in an amount between 0.01 and 1.0 wt % and preferably less than 1.0 wt %, more preferably less than 0.1 wt %, even more preferably less than 0.05 wt % relative to the total weight of components (a), (e) and (f).

The acidic grafting agent (e) is added in an amount between 0.01 and 1.00 wt % of acidic grafting agent (e) based on the amount of said copolymer (a).

It is especially preferred that the copolymer (a) is grafted with from 0.02 to 0.80 wt %, more preferably from 0.03 to 0.70 wt %, even more preferably from 0.04 to 0.60 wt % and most preferably from 0.05 to 0.50 wt % acidic grafting agent (b).

In one embodiment of the invention the composition suitably comprises additive(s).

In a preferable embodiment of the first aspect of the present invention the polymer composition consists of the copolymer (a) as the only polymeric component(s) and in a preferable embodiment of the second aspect of the present invention the polymer composition consists of the grafted copolymer (a') as the only polymeric component(s). "Polymeric component(s)" exclude herein any carrier polymer(s) of optional additive, e.g. carrier polymer(s) used in master batch(es) of additive(s) optionally present in the composition. Such optional carrier polymer(s) are calculated to the amount of the respective additive based on the amount (100%) of the polymer composition. The additives can alternatively be added by direct dosing without the use of a masterbatch.

Preferably, the interlayer element comprises a layer consisting of the polymer composition of the invention. Preferably, the interlayer element consists of the polymer composition of the invention.

The interlayer element is preferably an interlayer film, an interlayer sheet or an interlayer foil, most preferably an interlayer film.

Said interlayer element can be produced by extrusion, e.g. cast film or blown film extrusion, including coextrusion, using conventional extrusion equipment and extrusion conditions suitable for the desired end use of the interlayer element, which equipment and conditions can be selected by a skilled person. Alternatively said interlayer element can be produced by lamination using conventional lamination equipment and conditions suitable for the desired end use of the interlayer element, which equipment and conditions can be selected by a skilled person. Furthermore, said inter layer element may be produced using the combination of extrusion and lamination, as well known by a skilled person.

The interlayer element is preferably the sole polymeric layer element between the first and second layer element. Preferably, the interlayer element consists of one layer (monolayer element). Accordingly, the inter layer element is most preferably a monolayer element. The term "monolayer element" is understood herein as a single layer consisting of the polymer composition of the interlayer element of invention. I.e. "Single layer" means one or more layers, wherein in case of more layers, the layers consist of the polymer composition of the invention and are fused together resulting in one layer (monolayer). Accordingly said monolayer element as said interlayer element can be one layer (monolayer). Or alternatively, said monolayer element as said interlayer element can be produced by combination of two or more layers of the polymer composition of the invention which layers are then fused together (adhered) during the production process of the interlayer element. The layers can be produced e.g., by coextrusion or, alternatively, by extrusion and subsequent lamination. The one layer is typically produced by extrusion. The preferred interlayer element is monolayer element, wherein the layer(s) consist of the polymer composition of the invention.

The interlayer element, preferably the interlayer element as monolayer element may contain non-polymeric elements, like reinforcing material, such as wire web, which non-polymeric material may be embedded to the interlayer element for instance during the production of the interlayer element.

It is preferred according to the present invention that the interlayer element does not comprise an electronic device like a photovoltaic element.

In one embodiment, the interlayer element, which is preferably a monolayer element, contains non-polymeric elements selected reinforcing elements, thermal elements or electrically active elements, or any combinations thereof.

In a further embodiment, the interlayer element, which is preferably a monolayer element, contains non-polymeric elements selected from reinforcing elements or thermal elements, which are used in safety glass elements or thermal elements, or in any combinations thereof.

In a further embodiment, the interlayer element is a monolayer element and does not contain any non-polymeric elements as defined above.

The First and Second Layer Element of the Multilayer Element (LE)

The first layer element or the second layer element is preferably rigid. In one embodiment, both the first layer element and the second layer element are rigid.

The expression "rigid" means that the first or second, or both, layer element(s) is(are) non-flexible (i.e. stiff). I.e. the first or the second, or both, layer element(s), when in solid state, does(do) not return in original shape when deformed using force, e.g. compression, impact or bending force. For instance, glass element and polycarbonate (PC) polymer element are rigid elements. I.e. if bended or when broken due to use of impact force, then would break to pieces. E.g. in case of conventional window glass, the at least part of the glass pieces would normally fall apart (down).

The first layer element and the second layer element of the layer element (LE) can be same or different and comprise a glass layer element or a polymeric layer element. In one embodiment the first layer element and the second layer element are of the same material. Glass layer element of the first layer element and of the second layer element can be of any conventional glass material. Preferably, the glass layer element comprises, preferably consists of, one of, without limitation, window glass, plate glass, silicate glass, sheet glass, float glass, coloured glass or specialty glass such as alumina-silicate glass, High-Ion Exchange (HIETM) glass, soda-lime glass, borosilicate glass or ceramic glass.

The first and second glass layer element of the multilayer laminated glass layer element (GLE2)

Glass layer element of the first layer element and of the second layer element can be of any conventional glass material. Preferably, the glass layer element comprises, preferably consists of, one of, without limitation, window glass, plate glass, silicate glass, sheet glass, float glass, coloured glass or specialty glass such as alumina-silicate glass, High-Ion Exchange (HIETM) glass, soda-lime glass, borosilicate glass or ceramic glass.

The Multilayer Element (LE) and the Multilayer Laminated Glass Layer Element (GLE2)

The expression "adhering contact" is defined herein in that the surface of the interlayer element of the invention and the surface of the first layer element facing towards each other and the surface of the interlayer element of the invention and the surface of the second layer element facing towards each other are in adhering contact to each other either directly or via an adhesive layer.

The expression "adhesive layer" means a layer which is different from the interlayer element and which have different polymer composition than the polymer composition of the invention of the interlayer element. Moreover the adhesive layer is usually a continuous or discontinuous and known as hot melt adhesive, which has a well-known meaning in the prior art. Such adhesive layers have only enhancing adhering function, not the adhering function as defined for the interlayer element to keep the integrity of the first and the second layer elements.

More preferably, the surface of the interlayer element of the invention and the surface of the first layer element facing towards each other and the surface of the interlayer element of the invention and the surface of the second layer element facing towards each other are in direct contact to each other without any additional adhesive layers in between. FIG. 1 illustrates this most preferable embodiment.

Preferably there are no additional layers between the contacting surfaces of first layer element and the inter layer element and, respectively, between the contacting surfaces of the second layer element and the inter layer element, and the interlayer element is preferably a monolayer element.

The multilayer element (LE) and the multilayer laminated glass layer element (GLE2) are preferably transparent. The term "transparent" means herein that the multilayer element (LE) or the multilayer laminated glass layer element (GLE2), respectively, allows light to pass 100% or less through the multilayer element (LE) or the multilayer laminated glass layer element (GLE2), respectively, so that objects behind can be distinctly seen or at least outlined.

The transparency of the multilayer element (LE) or the multilayer laminated glass layer element (GLE2), respectively, can look like seen through a normal glass window. The multilayer element (LE) and the multilayer laminated glass layer element (GLE2), respectively, cover additionally the embodiments where the multilayer element (LE) or the multilayer laminated glass layer element (GLE2), respectively, is tinted (coloured) or otherwise designed as regards to appearance. Such tinted multilayer element (LE) or the multilayer laminated glass layer element (GLE2), respectively, can be treated in known manner so that the multilayer element (LE) or the multilayer laminated glass layer element (GLE2), respectively, is transparent from both sides or only from one side. Examples such tinted multilayer elements (LE) or the multilayer laminated glass layer element (GLE2), respectively, are articles, like tinted (coloured) glass door elements, tinted window elements in buildings or tinted window elements in vehicles, like cars.

The thickness of the first layer, second layer and interlayer element of the multilayer element (LE) or the multilayer laminated glass layer element (GLE2), respectively, as well as the thickness of the final multilayer element (LE) or of the multilayer laminated glass layer element (GLE2), respectively, can vary depending on the desired end application, as evident for a skilled person. For instance, the thickness of the first and second layer element can be within the ranges typically used in the prior art in the respective end application. The thickness of the interlayer element can also be chosen by the skilled person for the respective end application. As an example only thickness of the interlayer element can be in the range from 0.03 to 3.0 mm, like from 0.1 to 2.5 mm, such as from 0.2 to 2 mm. The exemplified thickness of the interlayer element most preferably is a monolayer element of one or two or more layers as defined above, wherein the layer(s) consist(s) of the polymer composition of the interlayer of the invention.

The invention further provides the use of the polymer composition as defined above or in claims for producing a multilayer element (LE) or a multilayer laminated glass layer element (GLE2), respectively, of the invention.

The invention further provides a process for producing the multilayer element (LE) or a multilayer laminated glass layer element (GLE2), respectively, of the invention, wherein the process comprises the steps of
- assembling the first layer element, interlayer element and the second layer element to a multilayer assembly;
- laminating the layers of the multilayer assembly at elevated temperature and optionally at vacuum conditions to obtain multilayer element (LE) or multilayer laminated glass layer element (GLE2), respectively; and
- recovering the obtained multilayer element (LE) or the obtained multilayer laminated glass layer element (GLE2), respectively.

The lamination step is typically carried out in two steps, in pre-lamination step and then in final lamination step. In pre-lamination step any air bubbles are removed between the layer elements of the multilayer (LE or GLE2, respectively) assembly. Air removal can be effected for instance by rolling press process or by vacuum process. The vacuum process can be carried out e.g. in so-called vacuum bag process or vacuum-ring process. The final lamination is carried out at elevated temperature and optionally, and preferably, under vacuum.

The lamination process/conditions and equipment are well known in the art, and can be chosen by a skilled person depending on the final end article of the multilayer element (LE) or the multilayer laminated glass layer element (GLE2), respectively.

Moreover, the pre-lamination and final lamination steps are typically carried out in the same lamination process.

In a specific embodiment the first aspect of the present invention relates to a laminated glass layer element (GLE1) comprising a first glass layer element, an interlayer element and a second glass layer element, in the given order, wherein
the interlayer element comprises a polymer composition comprising a copolymer (a) of ethylene and a $C_4$ to $C_8$ alpha olefin comonomer, the copolymer (a) having
(i) a density in a range of from 850 kg/m' to below 880 kg/m$^3$ (measured according to ISO 1183)
(ii) an MFR$_2$ in a range of from 0.1 to 20.0 g/10 min (measured according to ISO 1133 at 190° C. and a load of 2.16 kg) and,
which copolymer (a) optionally bears silane group(s) containing units (b) or unsaturated organic groups containing a carbonyl group (c) and
the interlayer element is in adhering contact with said first glass layer element and said second glass layer element.

Thereby, the laminated glass layer element (GLE1) includes all embodiments of the multilayer element (LE) with the specification that the first and second elements are glass layer elements.

Further, the first glass layer element and the second glass layer element include all embodiments as defined above and below for the first and second layer element of the first aspect when specified as glass layer elements.

The interlayer element and the polymer composition include all embodiments as defined above and below for the first aspect.

The multilayer element (LE), like preferable laminated glass layer element (GLE) shows preferably good optical properties such as low haze in addition to a consistent adhesion between the layers of the multilayer element (LE) and good quality to the multilayer element (LE), preferably to final laminated glass layer element (GLE), which prolongs the life of the end article as discussed above for the multilayer element (LE).

The multilayer laminated glass layer element (GLE2) shows good optical properties such as low haze in addition to a consistent adhesion between the layers of the multilayer laminated glass layer element (GLE2) and good quality to the multilayer laminated glass layer element (GLE2), which prolongs the life of the end article as discussed above for the multilayer laminated glass layer element (GLE2).

FIG. 1 illustrates the most preferable embodiment of the layer element (LE) and of the multilayer laminated glass layer element (GLE2) of the invention, wherein the surface of the interlayer layer element (i) facing the surface of the first layer element (1) are in direct contact with each other and preferably without any adhesive layer(s) in between; and, on the opposite side of the interlayer element (i), the surface of the interlayer layer element (i) facing the surface of the second layer element (2) are in direct contact with each other and preferably without any adhesive layer(s) in between.

The multilayer element (LE), the laminated glass layer element (GLE1), and the multilayer laminated glass layer element (GLE2) can for example be used for building and construction applications, architectural glasses, interior/exterior design applications as described above, below or in claims.

In one preferable embodiment the present invention is directed to a multilayer element (LE) for use in a safety layer element, an insulation layer element or a thermal layer element, or in any combination thereof, wherein the multilayer element (LE) comprises a first layer element, an interlayer element and a second layer element, in the given order, wherein
the first layer element comprises a glass layer or a polymeric layer;
the interlayer element comprises a polymer composition comprising a copolymer (a) of ethylene and a $C_4$ to $C_8$ alpha olefin comonomer, the copolymer (a) having
(i) a density in a range of from 850 kg/m$^3$ to below 880 kg/m$^3$ (measured according to ISO 1183)
(ii) an MFR$_2$ in a range of from 0.1 to 20.0 g/10 min (measured according to ISO 1133 at 190° C. and a load of 2.16 kg) and
which copolymer (a) optionally bears silane group(s) containing units (b) or unsaturated organic groups containing a carbonyl group (c) and
the second layer element comprises a glass layer or a polymeric layer; and wherein the interlayer element is in adhering contact with said first and second layer element.

An Article Comprising the Multilayer Element (LE) or the Multilayer Laminated Glass Layer Element (GLE2)

The invention further provides the use of the multilayer element (LE) as defined above, below or in claims, or the laminated glass element (GLE1) as defined above, below or in claims, or of the multilayer laminated glass layer element (GLE2) for producing an article comprising the multilayer element (LE), or the laminated glass layer element (GLE1), or the multilayer laminated glass layer element (GLE2) for construction applications, like elements in buildings, for instance architectural elements, such as exterior/interior elements, like facades outside the building, window elements, door elements or indoor wall elements etc.; for elements in bridges; for elements in vehicles, such as windows etc. in cars, trains, airplanes or ships; for elements in production equipment, like safety windows in machines etc.; for elements in household devices; for projection applications, like head-up displays, or for elements in furniture etc.; not limiting to above mentioned applications.

The invention further provides an article comprising the multilayer element (LE) or the multilayer laminated glass layer element (GLE2) of the invention.

The article can be for any application, like article for construction applications, like elements in buildings, for instance architectural elements, such as exterior/interior elements, like facades outside the building, window elements, door elements or indoor wall elements etc.; for elements in bridges; for elements in vehicles, such as windows etc. in cars, trains, airplanes or ships; for elements in production equipment, like safety windows in machines etc.; for elements in household devices; for projection applications, like head-up displays, or for elements in furniture etc.; not limiting to above mentioned applications, comprising the multilayer element (LE) as defined above, below or in claims, or the laminated glass element (GLE1) as defined above, below or in claims, or the multilayer laminated glass layer element (GLE2) as defined above, below or in claims.

The article of the invention can also be e.g. a construction element with integrated photovoltaics functionality. In this context, the article is part of the construction element and not a separate photovoltaic module device installed separately to the building, like on the roof of a building. I.e. the article of the invention is an integrated part of the construction element like wall or window of the building. Accordingly, the multilayer element (LE), the laminated glass element (GLE1), the multilayer laminated glass layer element (GLE2), or the article of the invention is not part of a Photovoltaic module device which comprises a front protective layer element, a front encapsulation layer element, a photovoltaic element, a rear encapsulation element and a protective backsheet element and which is produced as a separate article and installed as separate unit to a construction element.

In one preferable embodiment, the article is for applications wherein one or more of the safety, insulation or thermal properties are desired. As non-limiting example of such articles comprising the multilayer element (LE), or the laminated glass element (GLE1), or the multilayer laminated glass layer element (GLE2), as defined above, below or in claims, are e.g. articles for construction applications, like elements in buildings, for instance architectural elements, such as outdoor wall elements (i.e. facades outside the building), or indoor wall elements, window elements, door elements, etc.; for elements in bridges; for elements in vehicles (windows in cars, trains, airplanes, ships etc); for elements in production equipment, like safety windows in machines; for elements in household devices; for projection applications, like head-up displays, or for elements in furniture etc.

One example of the article, as defined above, below or in claims, is for instance selected from a safety layer element, an insulation layer element or a thermal layer element, or any combination thereof. Preferably, in this embodiment of the article, the safety layer element, the insulation layer element or the thermal layer element, or any combination thereof, consists of the layer element (LE) or the multilayer laminated glass layer element (GLE2), respectively.

In one preferable embodiment the article is a multilayer element (LE) which is a safety element, like safety glass, such as safety glass window element; a safety glass indoor or outdoor door element; a safety glass outdoor (facade) or indoor wall element of a building; or safety glass window in a vehicle, like in a car. The term "safety glass" covers herein the options where the first or second layer element material, or both, is/are glass or a polymeric material. In this embodiment the article is preferably a multilayer element (LE), preferably a glass laminate element (GLE1), which is a safety layer element, preferably a safety glass element, wherein at least one of first and second layer element of the layer element preferably comprises, preferably consists of, a glass layer. More preferably, in this embodiment, both the first and second layer element comprises, preferably consists of, a glass layer. More preferably, in this embodiment, the interlayer element is a monolayer element consisting of the polymer (a) of the invention.

In one preferable embodiment the article is a multilayer laminated glass layer element (GLE2) which is a safety element, like safety glass, such as safety glass window element; a safety glass indoor or outdoor door element; a safety glass outdoor (facade) or indoor wall element of a building; or safety glass window in a vehicle, like in a car. In this embodiment the article is preferably a multilayer laminated glass layer element (GLE2), which is a safety glass layer element. More preferably, in this embodiment, the interlayer element is a monolayer element consisting of the grafted copolymer (a') of the invention.

According to a preferred embodiment of the first aspect of the present invention the space between the first and second layer elements, respectively, consists of the interlayer element and the interlayer element consists of the polymer (a) of the invention or the interlayer element consists of a polymer part and non-polymeric elements, wherein the polymer part consists of polymer (a) of the invention, and wherein the non-polymeric elements are selected from the group consisting of heating means or thermal elements like electrical wires, reinforcing material such as wire web, electrically active elements, and combinations thereof, and/or wherein the non-polymeric elements do not comprise electronic devices like photovoltaic elements.

According to a preferred embodiment of the second aspect of the present invention the space between the first and second layer elements, respectively, consists of the interlayer element and the interlayer element consists of the polymer (a') of the invention or the interlayer element consists of a polymer part and non-polymeric elements, wherein the polymer part consists of polymer (a') of the invention, and wherein the non-polymeric elements are selected from the group consisting of heating means or thermal elements like electrical wires, reinforcing material such as wire web, electrically active elements, and combinations thereof, and/or wherein the non-polymeric elements do not comprise electronic devices like photovoltaic elements.

The invention further provides a process for producing an article comprising the multilayer element (LE) or the multilayer laminated glass layer element (GLE2), wherein the process comprises the steps of a) producing a multilayer element (LE) or a multilayer laminated glass layer element (GLE2) by
    assembling the first layer element, interlayer element and the second layer element to a multilayer assembly;
    laminating the layers of the multilayer assembly at elevated temperature and optionally at vacuum conditions to obtain multilayer element (LE) or multilayer laminated glass layer element (GLE2), respectively;
    and recovering the article comprising the obtained multilayer element (LE) or the multilayer laminated glass layer element (GLE2) of the invention.

In one embodiment of the first aspect of the invention, the process for producing an article of the invention comprises the steps of
- assembling the first layer element, like glass layer element, the interlayer element of the invention and the second layer element, like glass layer element, to a multilayer element (LE) assembly;
- subjecting the obtained assembly to so-called pre-lamination step to remove any air bubbles;
- subjecting the obtained pre-laminated multilayer element (LE) to heat and pressure to obtain the multilayer element (LE); and
- recovering the article comprising the obtained multilayer element (LE) of the invention.

In one embodiment of the second aspect of the invention, the process for producing an article of the invention comprises the steps of
- assembling the first glass layer element, the interlayer element of the invention and the second glass layer element, to a multilayer glass layer element (GLE2) assembly;
- subjecting the obtained assembly to so-called pre-lamination step to remove any air bubbles;
- subjecting the obtained pre-laminated multilayer glass layer element (GLE2) to heat and pressure to obtain the multilayer laminated glass layer element (GLE2); and
- recovering the article comprising the obtained multilayer laminated glass layer element (GLE2) of the invention.

Process for Producing a Multilayer Laminated Glass Layer Element (GLE2)

The present invention is in a further embodiment directed to a process for producing a multilayer laminated glass layer element (GLE2) as described above, below or in claims, the process comprising the following steps in the given order:
- providing a copolymer (a) of ethylene and a $C_4$ to $C_8$ alpha olefin comonomer, the copolymer (a) having a density in a range of from 850 kg/m$^3$ to below 880 kg/m$^3$ (measured according to ISO 1183) and an MFR$_2$ in a range of from 0.1 to 40.0 g/10 min (measured according to ISO 1133 at 190° C. and a load of 2.16 kg) by polymerizing ethylene with a $C_4$ to $C_8$ alpha olefin comonomer;
- grafting the copolymer (a) with an acidic grafting agent (e) thereby obtaining a grafted copolymer (a');
- producing an interlayer element by extrusion and/or lamination of the grafted copolymer (a');
- providing a first layer element and a second layer element;
- assembling the first layer element, the interlayer element and the second layer element to a multilayer assembly; and
- laminating the layers of the multilayer assembly at elevated temperature and optionally at vacuum conditions to obtain a multilayer laminated glass layer element (GLE2).

Determination Methods

Melt Flow Rate

The melt flow rate (MFR) is determined according to ISO 1133 and is indicated in g/10 min. The MFR is an indication of the flowability, and hence the processability, of the polymer. The higher the melt flow rate, the lower the viscosity of the polymer. The MFR$_2$ of polyethylene is measured at a temperature of 190° C. and a load of 2.16 kg.

Density

Density is determined according to ISO 1183, measured on compression moulded plaques.

Quantification of VTMS in PE-g-VTMS Copolymer

Quantitative nuclear-magnetic resonance (NMR) spectroscopy was used to quantify the VTMS content of the polymers.

Quantitative $^1$H NMR spectra recorded in the molten-state using a Bruker Avance III 500 NMR spectrometer operating at 500.13 MHz. All spectra were recorded using a $^{13}$C optimised 7 mm magic-angle spinning (MAS) probehead at 150° C. using nitrogen gas for all pneumatics. Approximately 200 mg of material was packed into a 7 mm outer diameter zirconia MAS rotor and spun at 4 kHz. This setup was chosen primarily for the high sensitivity needed for rapid identification and accurate quantification {klimke06, parkinson07, castignolles09}. Standard single-pulse excitation was employed applying short recycle delay of 2 s. A total of 128 transients were acquired per spectrum.

Quantitative $^1$H NMR spectra were processed, integrated and quantitative properties determined using custom spectral analysis automation programs. All chemical shifts are internally referenced to the polyethylene methylene signal at 1.33 ppm. Characteristic signals resulting from grafting of vinyltrimethylsiloxane, in various comonomer sequences, were observed. The vinyltrimethylsiloxane grafting was quantified using the integral of the signal at 3.52 ppm assigned to the 1VTMS sites {brandolini01}, accounting for the number of reporting nuclei per comonomer:

$$gVTMS=I_{1VTMS}/9$$

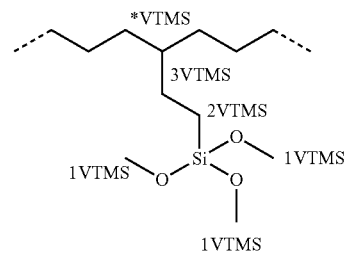

The ethylene content (E) was quantified using the integral of the bulk aliphatic (bulk) signal between 0.00-3.00 ppm. This integral must be compensated by subtracting 4 times gVTMS (2 methylene groups, 2VTMS and 3VTMS) and add once gVTMS (*VTMS missing 1 proton) in total subtracting 3 times gVTMS.

$$E=(bulk-3\times gVTMS)/4$$

It should be noted that an insignificant error is introduced due to the inability to compensate for the saturated chain ends without associated branch sites. The total mole fractions of vinyltrimethylsiloxane in the polymer was calculated as:

$$fVTMS=gVTMS/(E+gVTMS)$$

The total comonomer incorporations of vinyltrimethylsiloxane in weight percent was calculated from the mole fractions in the standard manner:

$$cVTMS\ [wt\ \%]=[100\times(fVTMS\times 148.23)]/[(fVTMS\times 148.23)+((1-fVTMS)\times 28.05)]$$

The quantification of grafted vinyltrimethylsiloxane in weight percent cVTMS [wt %] by $^1$H NMR as described is independent from additional alpha-co-olefins with even numbers of carbons e.g. C4, C6 or C8 which might be incorporated in the polyethylene chain.

brandolini01
A. J. Brandolini, D. D. Hills, "NMR spectra of polymers and polymer additives", Marcel Deker Inc., 2000 klimke06
Klimke, K., Parkinson, M., Piel, C., Kaminsky, W., Spiess, H. W., Wilhelm, M., Macromol. Chem. Phys. 2006; 207:382.

parkinson07
Parkinson, M., Klimke, K., Spiess, H. W., Wilhelm, M., Macromol. Chem. Phys. 2007; 208:2128.

castignolles09
Castignolles, P., Graf, R., Parkinson, M., Wilhelm, M., Gaborieau, M., Polymer 50 (2009) 2373

Haze

The light that passes through the transparent material can be affected by irregularities within it. This causes the light to scatter in different directions giving haze. The origin of the internal haze in pure polymers is light scattering due to different refractive index of crystalline and amorphous regions in the polymer. By laminating the interlayer between two glass slides, the direct transmittance, scattered transmittance, and reflectance is measured with an ultraviolet/visible/near infrared (UV/VIS/NIR) Perkin Elmer Lambda 900 spectrometer equipped with an integrating sphere. With an integrating sphere both the total transmittance i.e. direct transmittance+scattered transmittance and only the scattered (diffuse) transmittance can be recorded. The haze is calculated from the Equation below:

$$\text{Haze }(\lambda) = \frac{\text{diffuse transmittance }(\lambda)}{\text{total transmittance }(\lambda)} * 100\%$$

The sample preparation for haze measurements were done the following: Test interlayer elements were produced by extruding the material into tape samples on a Collin 15 extruder (Teach-Line E20T). The same temperature profile, 120-120-130° C., was used for producing the tape samples (test interlayer elements). The tape samples (test interlayer elements) had a thickness of 0.45 mm and a width of 40 mm. The obtained test interlayer elements were laminated between two microscope glasses with a thickness of 1 mm. The used laminator was a commercial PEnergy L036LAB vacuum laminator. The lamination temperature for forming the Test laminates samples was 150° C. with a total lamination time of 6 minutes (2 minutes vacuum and 4 minutes pressing time). Pressure during the lamination process was 200 mbar.

Experimental Part

The following materials have been used:
Copolymer (a)
Queo™ 7001LA is an ethylene based octene-1 elastomer produced in a solution polymerization process using a metallocene catalyst with a $MFR_2$ (2.16 kg, 190° C.) of 1.0 g/10 min and a density of 870 kg/m$^3$ and is commercially available from *Borealis AG, Austria*.

Queo™ 7007 LA is an ethylene based octene-1 elastomer produced in a solution polymerization process using a metallocene catalyst with a $MFR_2$ (2.16 kg, 190° C.) of 6.6 g/10 min and a density of 870 kg/m$^3$ and is commercially available from *Borealis AG, Austria*.

Queo™ 8207LA is an ethylene based octene-1 elastomer produced in a solution polymerization process using a metallocene catalyst with a $MFR_2$ (2.16 kg, 190° C.) of 6.6 g/10 min and a density of 882 kg/m$^3$ and is commercially available from Borealis AG, Austria.

EMA-VTMS terpolymer is a terpolymer of ethylene, methylacrylate (25.9 wt %) and vinyl trimethoxysilane (2.1 wt %), produced according to Inventive Example 3 of WO 2016/041922.

Grafting Component (b')
A commercially available mixture of VTMS+peroxide was used for the grafting step.

VTMS is vinyl trimethoxy silane (CAS-No 2768-02-7) The mixture used was Dynasylan® Silfin 24 from Evonik.

This mixture comprises more than 25% VTMS, more than 1% but below 5% di-tert-butyl 1,1,4,4-tetramethyltetramethylene diperoxide (CAS-No 78-63-7), and not more than 0.2% tetramethyl orthosilicate (CAS-No 681-84-5).

MAH (maleic anhydride)—provided by ESIM Chemicals
Silane Grafting Step of Copolymer (a):

The extruder used for the silane grafting was a Werner & Pfleiderer ZSK 30 co-rotating extruder with L/D of 38. Polymer throughput was 5 kg/h. Vacuum degassing was used (barrel 11) and the pressure was set to −0.20 bar (g). The temperature control of the extruder barrels was divided into control sections. Barrels 2&3, 5&6, 7&8, 9&10 and 11&12 share the same control loop in pairs and only took measurement from one barrel per pair. Barrel 4 was the only one with its own control loop. The barrels were heated with electrical heaters and cooled with closed loop water-glycol circulation. In addition to the temperature measurements from the barrels, the melt temperature and pressure at the die plate were also measured. The temperature profile of the Barrels 2&3 was set at 140° C., for Barrel 4 the temperature was 180° C. and the rest of the Barrels were set at a temperature of 200° C. The residence time was 60 seconds.

Queo 7001LA was grafted with 1.0 wt % of the VTMS-peroxide mixture.

MAH-Grafting Step of Copolymer (a):
The extruder used for the MAH-grafting was a Werner & Pfleiderer ZSK 30 co-rotating extruder with L/D of 38 with 12 barrels. The temperature control of the extruder barrels was divided into 6 control sections. Barrel 1 was the feeding section. Barrels 2&3, 5&6, 7&8, 9&10 and 11&12 share the same control loop in pairs and only took measurement from one barrel per pair. Barrel 4 was the only one with its own control loop. The barrels were heated with electrical heaters and cooled with closed loop water-glycol circulation if necessary, or were not cooled (in normal operation typically no cooling is necessary). In addition to the temperature measurements from the barrels, the melt temperature and pressure at the die plate were also measured.

The following temperatures of the different zones of the extruder as listed below were targeted for the examples:

| | |
|---|---|
| Temperature Feeding zone [° C.] | <40 |
| Temperature Control zone 1 [° C.] | 180 |
| Temperature Control zone 2 [° C.] | 200 |
| Temperature Control zone 3 [° C.] | 200 |
| Temperature Control zone 4 [° C.] | 200 |
| Temperature Control zone 5 [° C.] | 200 |
| Temperature Control zone 6 [° C.] | 200 |
| Temperature die plate [° C.] | 200 |

Queo 7007LA was grafted by adding various amounts of maleic anhydride (MAH) as indicated in Table 1 below. The peroxide initiator (0.1 wt % PDX—Perkadox 14S-fl, Akzo Nobel) was fed as a 10% isododecane solution.

A dry blend of Queo 7007LA and MAH was fed through the hopper into the feeding section of the extruder. The POX solution was fed into a side feeding entrance into the feeding section of the extruder. The scew speed was 200 rpm, throughput was 8 kg/h. The residence time was 60 seconds.

TABLE 1

Inventive and Comparative Examples

| Example | | Amount MAH added/wt % |
|---|---|---|
| IE1 | VTMS-g-Queo 7001LA | — |
| IE2 | non-grafted Queo 7001LA | — |
| IE3 | non-grafted Queo 7007LA | — |
| CE1 | non-grafted Queo 8207LA | — |
| CE2 | Non-grafted EMA-VTMS | — |
| CE3 | — | 0.00 |
| IE4 | — | 0.07 |
| IE5 | — | 0.12 |
| IE6 | — | 0.21 |

Optical Properties

The haze performance of the inventive test laminate samples IE1 to IE6 and of the Comparative Examples CE1 to CE3 were measured using the Haze determination method as described above under Determination methods. The preparation of the test laminate samples IE1 to IE6 and of the Comparative Examples CE1 to CE3 was carried out as described above in Haze method description under Determination methods.

Figure 2:
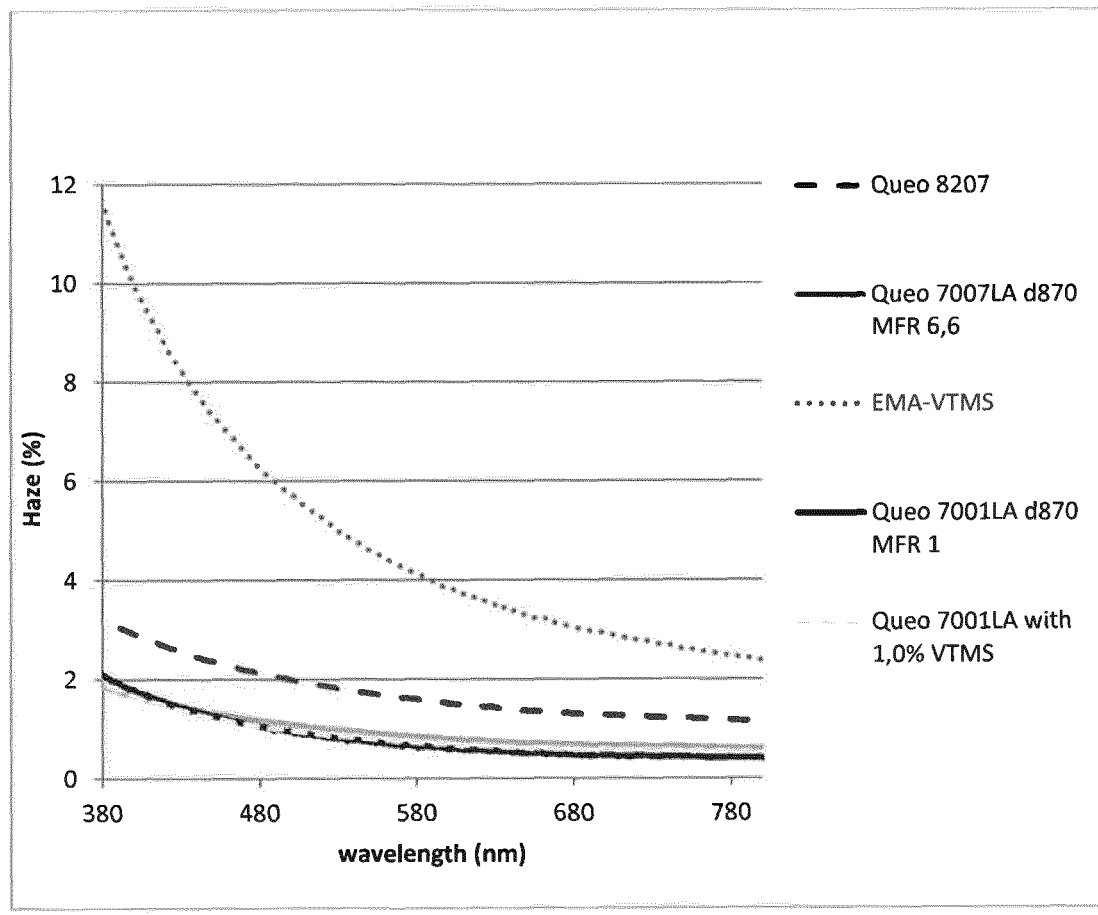
FIG. 2 shows the haze % as function of wavelength (nm) of laminate samples IE1 to IE3 in comparison to CE1 and CE2.

FIG. 2 shows the haze % as function of wavelength (nm) of laminate samples IE1 to IE3 in comparison to CE1 and CE2.

Figure 3:
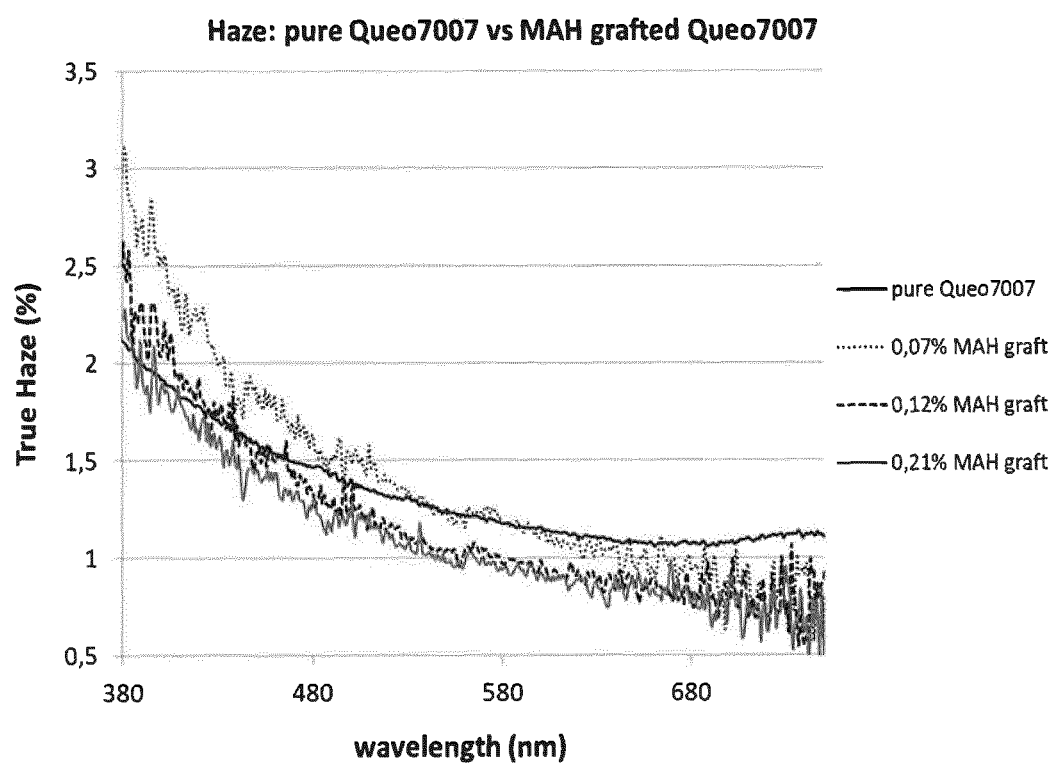
FIG. 3 shows the haze % as function of wavelength (nm) of laminate samples IE4 to IE6 in comparison to CE3.

FIG. 3 shows the haze % as function of wavelength (nm) of laminate samples IE4 to IE6 in comparison to CE3.

The data given in the figures show that the haze performance (low haze) of the composition of the interlayer element of the invention, of the multilayer element (LE) of the invention, and of the multilayer laminated glass layer element (GLE2) of the invention is highly feasible for producing articles for versatile end applications wherein good optical properties, like low haze, are desired.

Haze values were calculated for the wavelength 550 nm:

| Example | Haze at 550 nm | Haze drop/% |
|---|---|---|
| CE3 | 1.24 | — |
| IE4 | 1.23 | 1 |
| IE5 | 1.04 | 16 |
| IE6 | 0.98 | 21 |

As can be seen from the example above there is a clear effect of MAH on haze. The higher the amount of MAH grafted onto the copolymer (a) the lower is the haze measured on glass-glass laminates.

The invention claimed is:

1. A multilayer element (LE), wherein the multilayer element (LE) comprises a first layer element, an interlayer element, and a second layer element, wherein
the first layer element comprises a glass layer or a polymeric layer;
the interlayer element comprises a polymer composition comprising a copolymer (a) of ethylene and 1-octene, the copolymer (a) having
(i) a density in a range of from 855 kg/m³ to 875 kg/m³ (measured according to ISO 1183) and
(ii) an $MFR_2$ in a range of from 0.1 to 20.0 g/10 min (measured according to ISO 1133 at 190° C. and a load of 2.16 kg), and
which copolymer (a) bears silane group(s) containing units (b) or unsaturated organic groups containing a carbonyl group (c) and
the second layer element comprises a glass layer element or a polymeric layer element;
and wherein the interlayer element is in adhering contact with said first and second layer element;
wherein the silane group(s) containing unit (b) is introduced into copolymer (a) by a grafting component (b') which is a hydrolysable unsaturated silane compound represented by the formula (I):

$$R^1 SiR^2_q Y_{3-q} \quad (I)$$

wherein
R¹ is an ethylenically unsaturated hydrocarbyl, hydrocarbyloxy, or (meth)acryloxy hydrocarbyl group,
each R² is independently an aliphatic saturated hydrocarbyl group,
Y, which may be the same or different, is a hydrolysable organic group, and
q is 0, 1, or 2;
wherein the amount of the silane group(s) containing unit is of 0.1 to 2.0 wt %, and
wherein the interlayer element is a monolayer element consisting of the polymer composition of the interlayer element and/or the
multilayer element is transparent.

2. The multilayer element (LE) according to claim 1, wherein the first and the second layer element are rigid layer elements.

3. The multilayer element (LE) according to claim 1, wherein the copolymer (a) has an $MFR_2$ in the range of from 0.5 to 15.0 g/10 min and a melting temperature below 100° C.

4. The multilayer element (LE) according to claim 1, wherein the silane group(s) containing unit (b) is derived from a grafting component (b') which is selected from vinyl trimethoxysilane or vinyl triethoxysilane.

5. A multilayer laminated glass layer element (GLE2) comprising a first glass layer element, an interlayer element, and a second glass layer element, in the given order, wherein
the interlayer element comprises a polymer composition comprising a copolymer (a) of ethylene and 1-octene, which has been grafted with an acidic grafting agent (e),
the copolymer (a) before grafting having
a density in a range of from 850 kg/m³ to below 880 kg/m³ (measured according to ISO 1183) and
an $MFR_2$ in a range of from 0.1 to 40.0 g/10 min (measured according to ISO 1133 at 190° C. and a load of 2.16 kg), and
wherein the interlayer element adheres to said first and second glass layer element, and
wherein interlayer element is a monolayer element consisting of the polymer composition of the interlayer element and/or the multilayer element is transparent.

6. The multilayer laminated glass layer element (GLE2) according to claim 5, wherein the copolymer (a) has an $MFR_2$ in the range of from 0.5 to 20.0 g/10 min and a melting temperature in a range of from 30° C. to below 100° C.

7. The multilayer laminated glass layer element (GLE2) according to claim 5, wherein the acidic grafting agent (e) is selected from acrylic acid, methacrylic acid, fiunaric acid, maleic acid, nadic acid, citraconic acid, itaconic acid, crotonic acid, and their anhydrides, metal salts, esters amides and imides.

8. The multilayer laminated glass layer element (GLE2) according to claim 7, wherein the acidic grafting agent (e) is maleic acid anhydride (MAH).

9. The multilayer laminated glass layer element (GLE2) according to claim 5, wherein the copolymer (a) is grafted with from 0.01 and 1.00 wt % of the acidic grafting agent (e).

* * * * *

UNITED STATES PATENT AND TRADEMARK OFFICE
CERTIFICATE OF CORRECTION

PATENT NO. : 11,504,949 B2  
APPLICATION NO. : 17/047350  
DATED : November 22, 2022  
INVENTOR(S) : Oderkerk et al.

Page 1 of 1

It is certified that error appears in the above-identified patent and that said Letters Patent is hereby corrected as shown below:

On the Title Page

Item (72), Line 3: replace "Linz (DE)" with "Linz (AT)"
Item (72), Line 4: replace "Linz (DE)" with "Linz (AT)"

Signed and Sealed this  
Third Day of January, 2023

Katherine Kelly Vidal  
*Director of the United States Patent and Trademark Office*